(12) United States Patent
Zhao

(10) Patent No.: US 10,980,123 B2
(45) Date of Patent: Apr. 13, 2021

(54) ELECTRIC ELEMENT

(71) Applicant: Murata Manufacturing Co., Ltd., Nagaokakyo (JP)

(72) Inventor: Lijun Zhao, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/515,058

(22) Filed: Jul. 18, 2019

(65) Prior Publication Data

US 2019/0342999 A1     Nov. 7, 2019

Related U.S. Application Data

(63) Continuation of application No. PCT/JP2018/003808, filed on Feb. 5, 2018.

(30) Foreign Application Priority Data

Feb. 10, 2017   (JP) .............................. JP2017-023262

(51) Int. Cl.
    *H05K 1/02*         (2006.01)
    *H05K 1/18*         (2006.01)

(52) U.S. Cl.
    CPC ................ *H05K 1/18* (2013.01); *H05K 1/02* (2013.01)

(58) Field of Classification Search
    CPC . H01P 3/08; H01P 3/085; H01P 3/026; H05K 1/02; H05K 1/18; H05K 1/0271;

(Continued)

(56) References Cited

U.S. PATENT DOCUMENTS

| 2010/0084160 | A1 | 4/2010 | Braun et al. |
| 2013/0188369 | A1* | 7/2013 | Chien ............... F21V 29/773 |
| | | | 362/363 |

(Continued)

FOREIGN PATENT DOCUMENTS

| JP | 2012182353 A | * | 9/2012 | ............... H05K 1/02 |
| WO | 2015/087893 A1 | | 6/2015 | |

(Continued)

OTHER PUBLICATIONS

Official Communication issued in International Patent Application No. PCT/JP2018/003808, dated Apr. 24, 2018.

*Primary Examiner* — Timothy J Thompson
*Assistant Examiner* — Guillermo J Egoavil
(74) *Attorney, Agent, or Firm* — Keating & Bennett, LLP

(57) ABSTRACT

An electric element includes a conducting path connecting electrodes and an insulating layer covering the conducting path. The electric element includes bonding portions in which the electrodes are disposed and a line portion connecting between the bonding portions. The line portion has a curved region sandwiched by portions having an outer shape curved on both sides of the insulating layer disposed to sandwich the conducting path. The line portion includes bonding patterns including metal surfaces exposed from the insulating layer. Each of contours of the bonding patterns includes at least two linear sides. At least two sides of the contour of a first bonding pattern disposed in the curved region are parallel or substantially parallel to at least two sides of a contour of at least one of the bonding patterns adjacent in an extending direction of the line portion.

10 Claims, 13 Drawing Sheets

(58) Field of Classification Search
CPC .... H05K 1/0218; H05K 1/113; H05K 1/0239; H05K 1/0242; H05K 1/0245; H05K 1/0298; H05K 1/0313; H05K 1/111; H05K 1/141; H05K 1/147; H05K 1/0243; H05K 1/144; H05K 3/3431; H05K 3/3452; H05K 2201/0141
USPC .......................................... 174/250; 333/238
See application file for complete search history.

(56) References Cited

U.S. PATENT DOCUMENTS

2016/0064793 A1    3/2016    Yosui
2017/0125870 A1    5/2017    Baba et al.

FOREIGN PATENT DOCUMENTS

| WO | WO-2015087893 A1 | * | 6/2015 | ............. H01P 3/085 |
| WO | 2016/088592 A1 | | 6/2016 | |
| WO | WO-2016088592 A1 | * | 6/2016 | ............. H05K 1/147 |

* cited by examiner

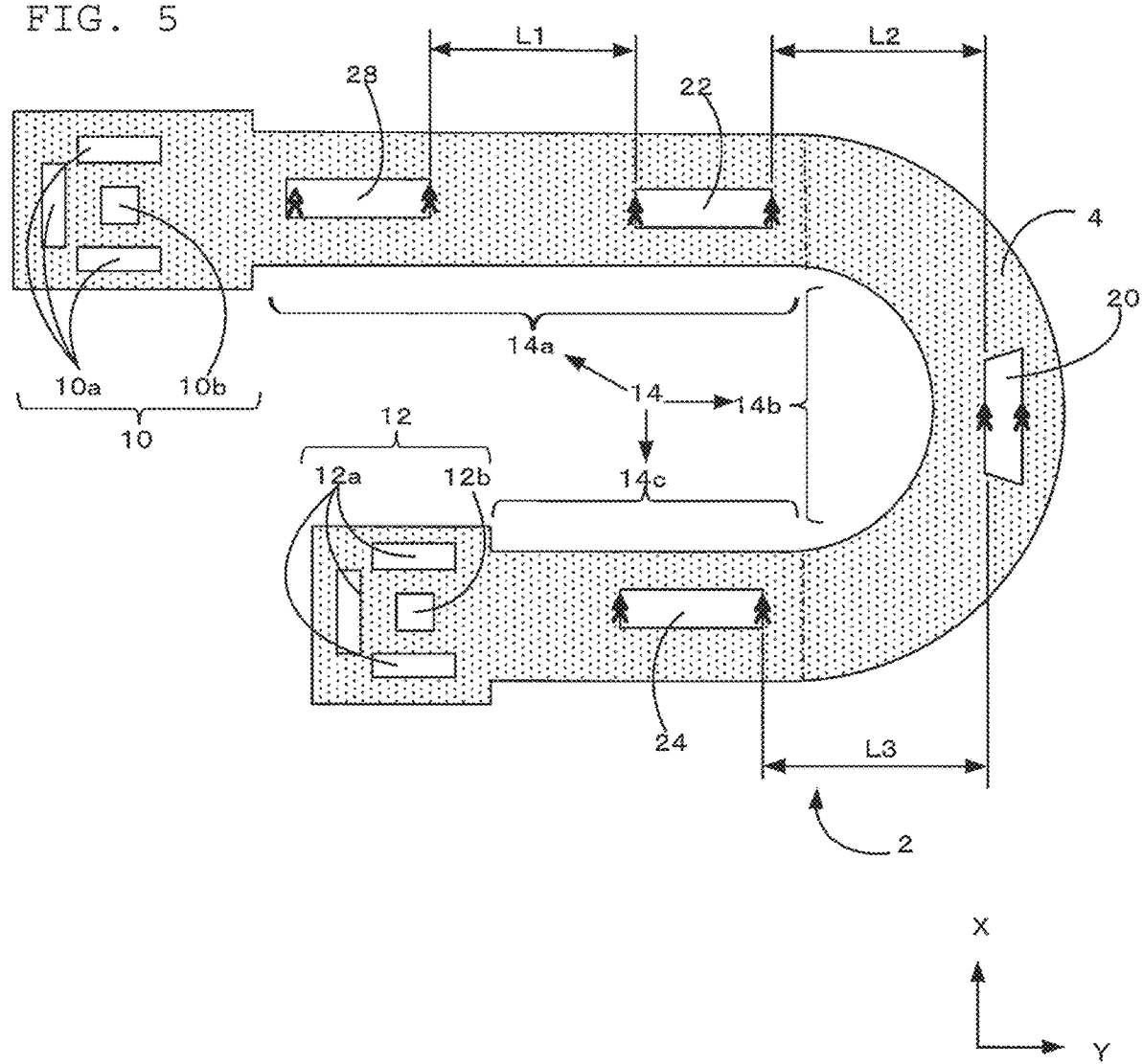

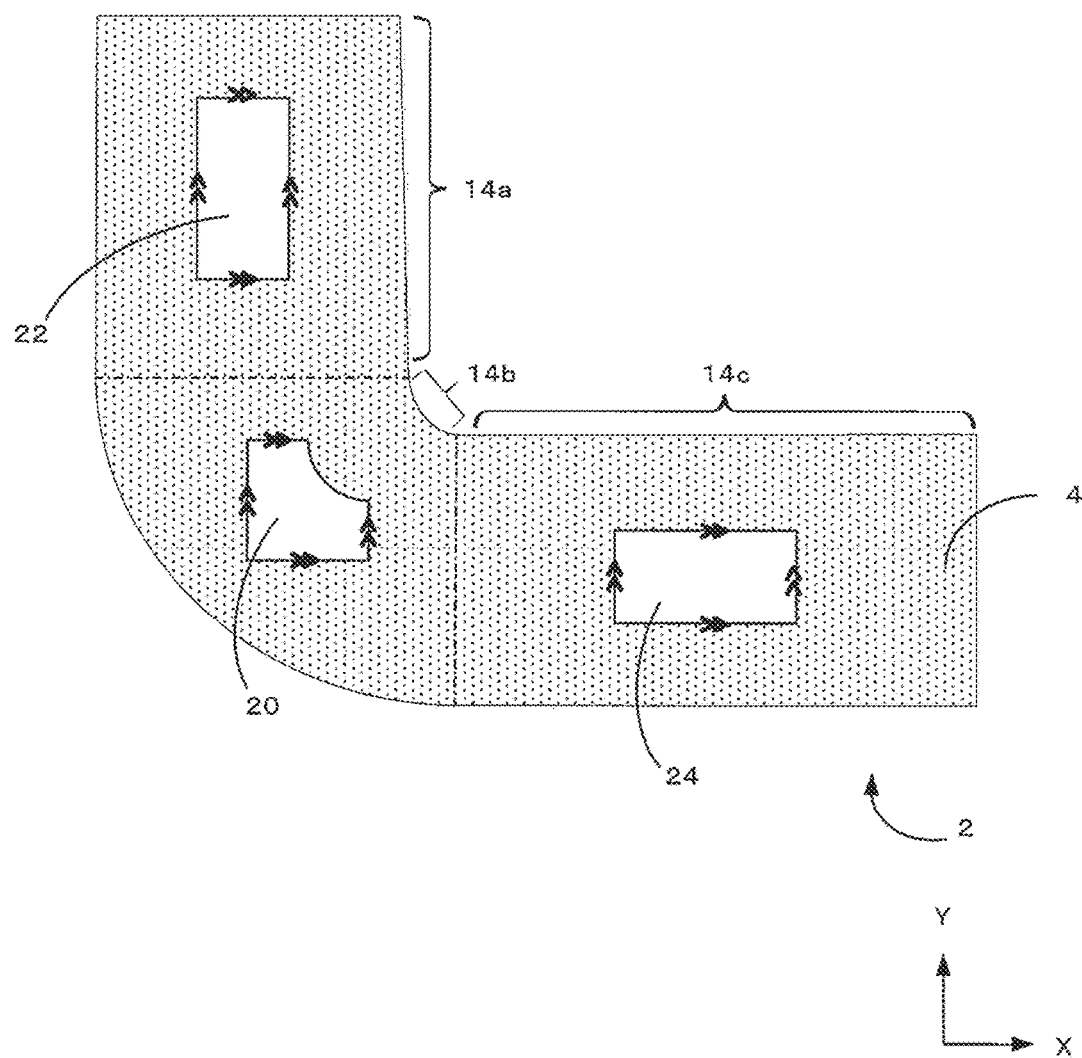

ELECTRIC ELEMENT

CROSS REFERENCE TO RELATED APPLICATIONS

This application claims the benefit of priority to Japanese Patent Application No. 2017-023262 filed on Feb. 10, 2017 and is a Continuation Application of PCT Application No. PCT/JP2018/003808 filed on Feb. 5, 2018. The entire contents of each application are hereby incorporated herein by reference.

BACKGROUND OF THE INVENTION

1. Field of the Invention

The present invention relates to an electric element including a conducting path covered with an insulator.

2. Description of the Related Art

As terminal housings are reduced in thickness, electric elements having a flat cross-sectional shape are increasingly used, instead of coaxial cables. Such an electric element has an elongated shape, which makes it difficult to stably dispose on a substrate a line portion between bonding portions in which electrodes are disposed.

In an electric element proposed to cope with this situation, a line portion is provided with a plurality of connection patterns in which a ground conductor is exposed from an insulating layer, and the connection patterns are fixed by soldering to ground patterns on the substrate side (e.g., WO 2016/088592).

When an electric element is mounted on a substrate, generally, the electric element is placed on a pattern of a substrate with solder applied thereto and is passed through a reflow furnace together with other elements for batch soldering. In this case, the solder heated and melted in the reflow furnace flows due to surface tension along an electrode pattern shape. Although the electronic element described in WO 2016/088592 does not include a curved region with an outer shape curved on both sides, an electronic element including a curved region tends to cause a bonding failure due to an excessively large interval of bonding patterns unless a bonding pattern is disposed in the curved region. On the other hand, as in a comparative example shown in FIG. 10, if a bonding pattern is disposed along a curved region (a region between dashed-dotted lines), it is conceivable that the bonding pattern is formed along an outer shape or an extending direction of a line portion 120 (see arrows). However, if the bonding pattern is disposed along the curved region having a curved shape, a direction of stress associated with a flow of solder during melting becomes non-uniform due to the shape of the bonding pattern, and misalignment easily occurs.

SUMMARY OF THE INVENTION

Preferred embodiments of the present invention provide electric elements that are each capable of reducing or preventing the occurrence of misalignment relative to a substrate at the time of mounting using reflow.

An electric element according to a preferred embodiment of the present invention includes a conducting path connecting electrodes and an insulating layer covering the conducting path. The electric element includes bonding portions in which the electrodes are disposed and a line portion connecting between the bonding portions, wherein the line portion includes a curved region sandwiched by portions having an outer shape curved on both sides of the insulating layer disposed to sandwich the conducting path, the line portion is provided with a plurality of bonding patterns including metal surfaces exposed from the insulating layer, each of contours of the bonding patterns includes at least two linear sides, and at least two sides of a contour of a first bonding pattern disposed in the curved region are parallel or substantially parallel to at least two sides of a contour of at least one of the bonding patterns adjacent in an extending direction of the line portion.

Preferred embodiments of the present invention provide electric elements that are each capable of reducing or preventing the occurrence of misalignment relative to a substrate at the time of mounting using reflow.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5 is a plan view schematically showing an electric element according to a second preferred embodiment of the present invention.

FIG. 9 is a plan view schematically showing an electric element according to a sixth preferred embodiment of the present invention.

DETAILED DESCRIPTION OF THE PREFERRED EMBODIMENTS

Figure 1A:
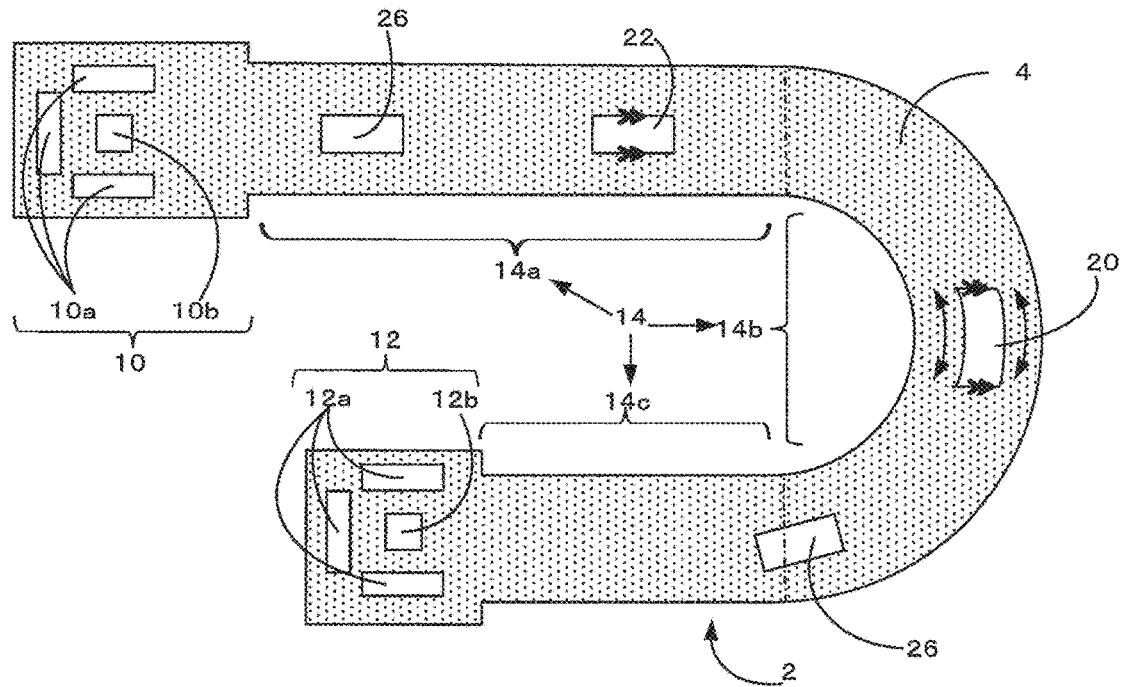
FIGS. 1A and 1B are plan views schematically showing an electric element according to a first preferred embodiment of the present invention.

An electric element according to a preferred embodiment of the present invention includes a conducting path connecting electrodes and an insulating layer covering the conducting path, the electric element including bonding portions in which the electrodes are disposed and a line portion connecting between the bonding portions, wherein the line portion includes a curved region sandwiched by portions having an outer shape curved on both sides of the insulating layer disposed to sandwich the conducting path, the line portion is provided with a plurality of bonding patterns including metal surfaces exposed from the insulating layer, each of contours of the bonding patterns includes at least two linear sides, and at least two sides of a contour of a first bonding pattern disposed in the curved region are parallel or substantially parallel to at least two sides of a contour of at least one of the bonding patterns adjacent in an extending direction of the line portion.

The conducting path connecting the electrodes is preferably made of a metal material, such as copper, for example, having excellent conductivity and may be not only a path defining and functioning as a signal conductor or a power transmission conductor, but also a path defining and functioning as a ground conductor. The electrodes and the bonding patterns are configured such that the metal surfaces are exposed from the insulating layer. The bonding patterns may be provided, for example, by exposing a conducting path defining and functioning as a ground conductor from the insulating layer, or by exposing a metal dedicated to the bonding patterns from the insulating layer.

The line portion may include a linear region having an outer shape linearly extending on both sides and a curved region having an outer shape curved on both sides or may include only the curved region. More specifically, the curved region is a region sandwiched by portions having an outer shape curved on both sides of the insulating layer sandwiching (disposed to sandwich) particularly a signal conductor. The contours of the bonding patterns have a planar shape defining an outer shape of a metal surface exposed from the insulating layer and preferably include, for example, a polygonal shape and a shape including two or more sides and a curved portion.

The "side" is a "line segment" that is a portion of a shape and is generally interpreted as a straight line. However, in the above description, it is described that "each of contours of the bonding patterns includes at least two linear sides" to make clarify the structure. The "at least two sides" may be not only "two opposite sides" or "two adjacent sides connected via a vertex" as described later but also "two sides connected via a curved portion" and may be two arbitrarily arranged sides of the contour of the bonding pattern.

When solder is heated and melted in a reflow furnace and the solder flows, a self-alignment action occurs such that the electric element moves due to surface tension. In this case, if two sides of the first bonding pattern disposed in the curved region are parallel or substantially parallel to two sides of at least one of the adjacent bonding patterns, a stress generation direction is uniform when the solder flows. As a result, the occurrence of misalignment of the electric element relative to a substrate is able to be reduced or prevented at the time of mounting using reflow.

In the case that the at least two sides are two opposite sides, the stress generation direction is able to be effectively made uniform when the solder flows. The two opposite sides may be parallel or substantially parallel or may not be parallel.

Furthermore, four sides of the contour of the first bonding pattern disposed in the curved region are preferably parallel or substantially parallel to four sides of the contour of at least one of the bonding patterns adjacent in the extending direction of the line portion.

The four sides of the contour of the bonding pattern may be two pairs of two opposite sides or may be four sides arranged at any other positions. In the case that the first bonding pattern and at least one of the adjacent bonding patterns are parallel or substantially parallel on four sides, the stress generation direction is able to be further effectively made uniform when the solder flows.

Additionally, at least two sides of the contour of the first bonding pattern are preferably parallel or substantially parallel to at least two sides of each of contours of a second bonding pattern and a third bonding pattern that are bonding patterns on both sides adjacent in the extending direction of the line portion.

In this case, since at least two sides are parallel or substantially parallel to two sides between the first bonding pattern and the second bonding pattern and between the first bonding pattern and the third bonding pattern, the stress generation direction is able to be more effectively made uniform when the solder flows.

Furthermore, an interval of closest sides parallel or substantially parallel to each other between the first bonding pattern and the second bonding pattern is preferably equal or substantially equal to an interval of closest sides parallel or substantially parallel to each other between the first bonding pattern and the third bonding pattern.

In this case, since the interval between the first bonding pattern and the second bonding pattern is equal or substantially equal to the interval between the first bonding pattern and the third bonding pattern, the symmetry is improved at stress generation positions, and the occurrence of misalignment of the electric element relative to the substrate is able to more effectively reduced or prevented at the time of mounting using reflow.

Furthermore, four or more adjacent bonding patterns including at least the first bonding pattern, the second bonding pattern, and the third bonding pattern preferably have equal or substantially equal intervals between closest sides parallel or substantially parallel to each other.

In this case, since the intervals are equal or substantially equal among more adjacent bonding patterns including the first bonding pattern, the second bonding pattern, and the third bonding pattern, the symmetry is improved at stress generation positions, and the occurrence of misalignment of the electric element relative to the substrate is able to be further effectively reduced or prevented at the time of mounting using reflow.

Additionally, at least two sides parallel or substantially parallel may be two adjacent sides connected via a vertex. Even in this case, the stress generation direction is able to be made uniform in the directions of respective sides when the solder flows, and therefore, the occurrence of misalignment of the electric element relative to the substrate is able to be reduced or prevented at the time of mounting using reflow.

In the case that the electric element has an elongated shape, when the electric element is long, it is not easy to prevent the misalignment of the elongated object when the solder flows. However, the configuration as described above is able to reliably reduce or prevent the occurrence of misalignment of the electric element relative to the substrate at the time of mounting using reflow.

In the case that the width of the line portion is narrower than the width of the bonding portions, it is not easy to prevent the misalignment of the line portion when the solder flows. However, the configuration as described above is able to reliably reduce or prevent the occurrence of misalignment of the electric element relative to the substrate at the time of mounting using reflow.

In the case that the electric element is surface-mounted on the substrate by a bonding material, a high-quality electronic device with little misalignment of the electric element relative to the substrate is provided.

Preferred embodiments of the present invention will hereinafter be described with reference to the drawings. In the drawings, corresponding members having the same functions are denoted by the same reference numerals. Although the preferred embodiments are separately described for convenience in consideration of facilitating explanation or understanding of main points, configurations described in different preferred embodiments may partially be replaced or combined. In the second and subsequent preferred embodiments, matters common to the first preferred embodiment will not be described, and only the differences will be described. Particularly, the same advantageous effects according to the same configurations will not be described in each preferred embodiment.

In all of the drawings, the lamination direction of the electric element, i.e., the thickness direction of the electric element, is defined as a Z-axis direction, and directions orthogonal or substantially orthogonal to each other on the plane orthogonal or substantially orthogonal to the Z-axis direction are shown as an X-axis direction and a Y-axis direction.

First Preferred Embodiment

Figure 1B:
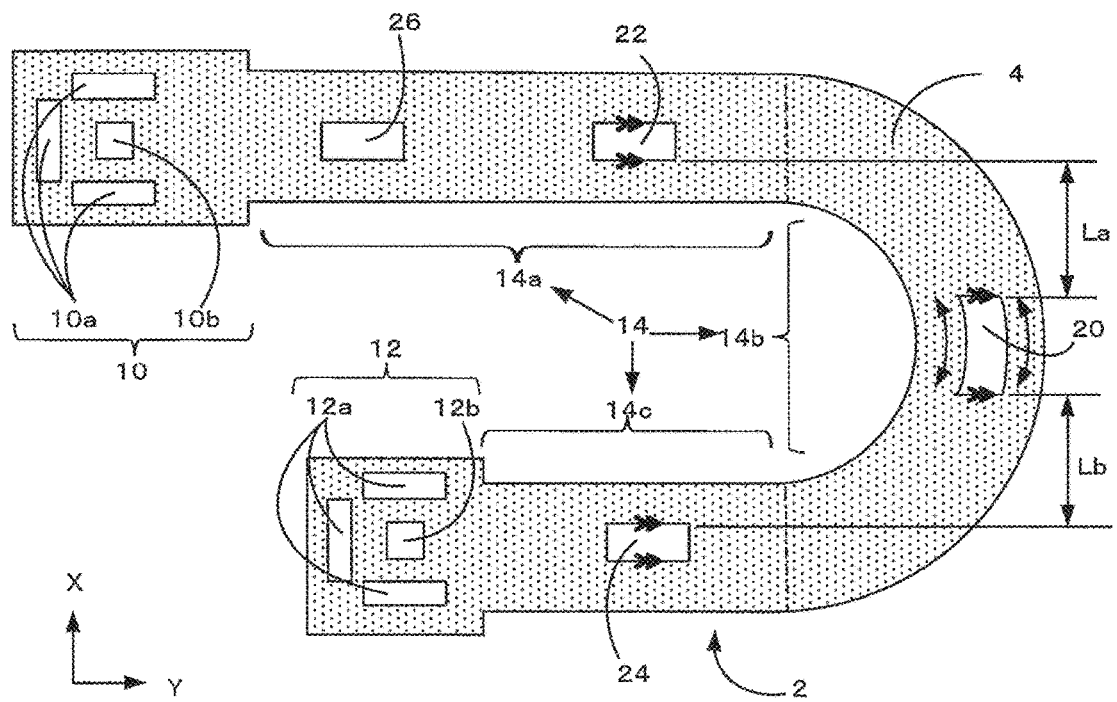
Figure 2A:
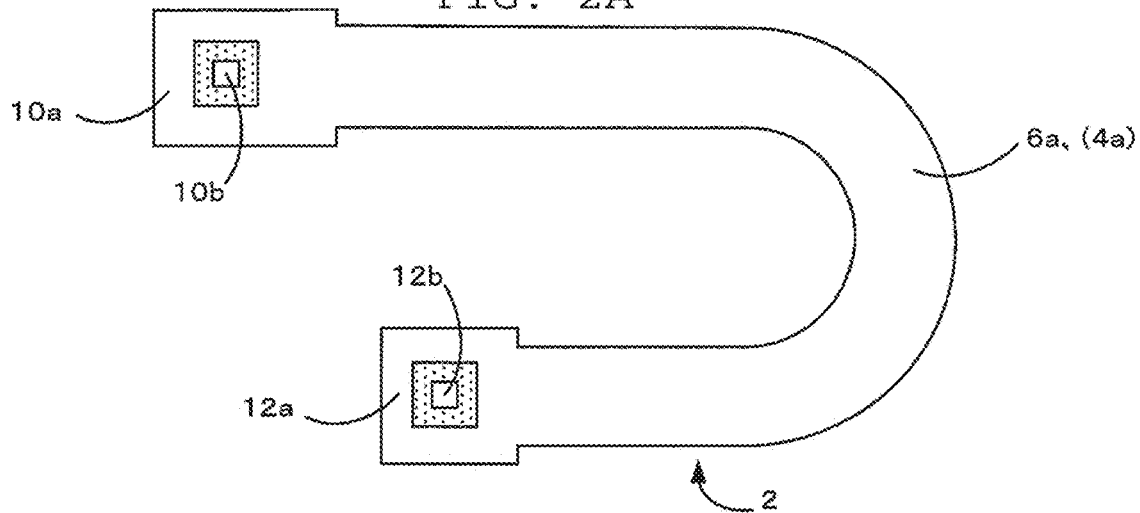
FIGS. 2A, 2B, and 2C are plan views schematically showing an example of an insulating layer in which a wiring pattern defining the electric element shown in FIGS. 1A and 1B is provided.
Figure 2B:
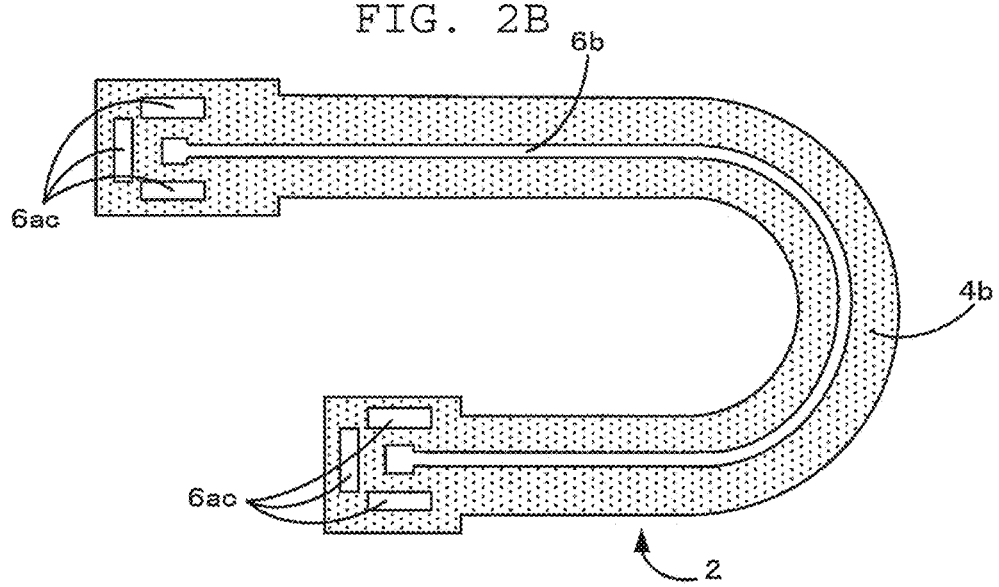
Figure 2C:
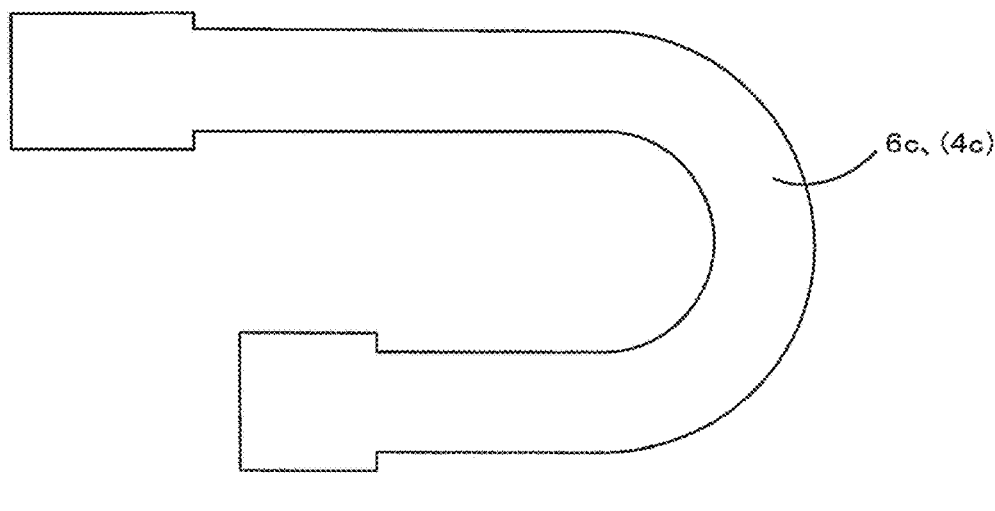
Figure 3A:
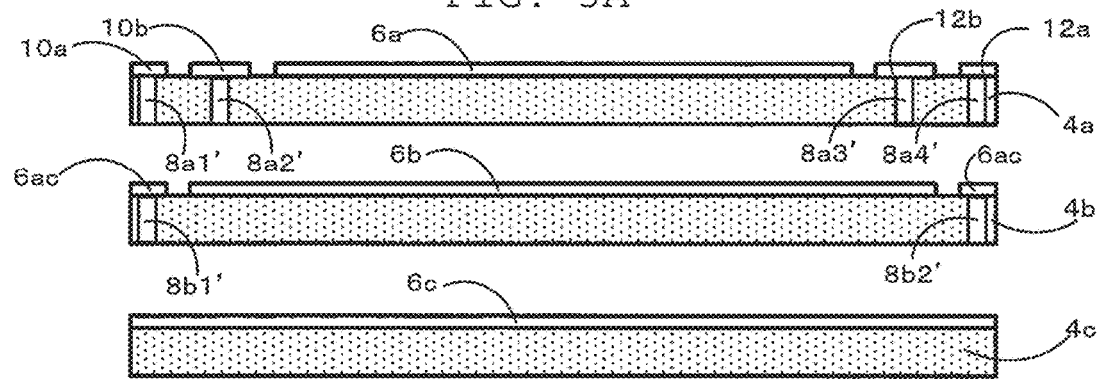
FIGS. 3A to 3C schematically show an example of a method of manufacturing the electric element shown in FIGS. 1A and 1B.
Figure 3B:
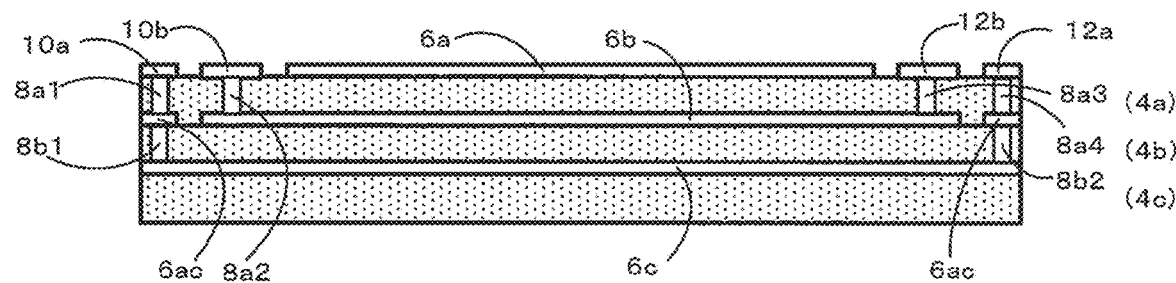
Figure 3C:
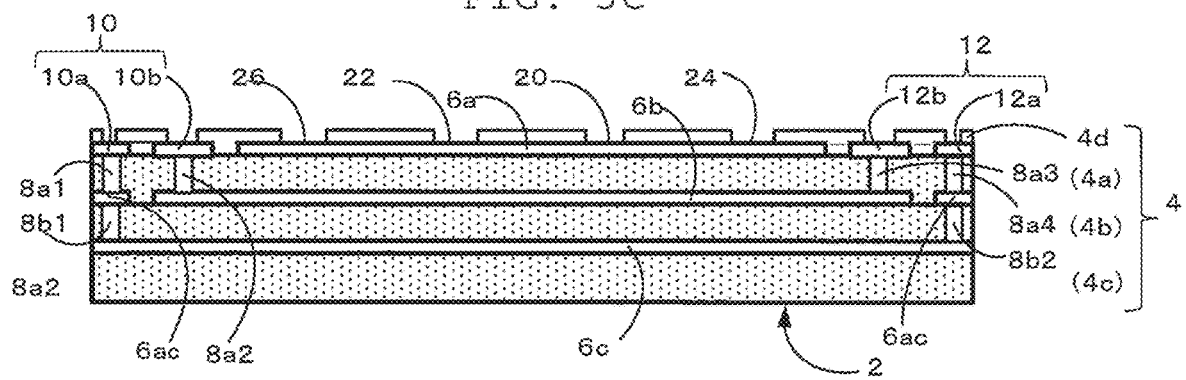

FIGS. 1A and 1B are plan views schematically showing an electric element according to a first preferred embodiment of the present invention. FIGS. 2A to 2C are plan views schematically showing an example of an insulating layer in which a wiring pattern defining the electric element shown in FIGS. 1A and 1B is provided. FIGS. 3A to 3C schematically show an example of a method of manufacturing the electric element shown in FIGS. 1A and 1B.

As shown in FIGS. 2A and 2B and 3A, an electric element 2 according to the present preferred embodiment includes a ground conductor 10a and an electrode 10b of a signal conductor disposed in a first bonding portion 10; a ground conductor 12a and an electrode 12b of a signal conductor disposed in a second bonding portion 12; a conducting path 6a disposed between the first bonding portion 10 and the second bonding portion 12 to function as a ground conductor conductive with the ground conductors 10a and 10b; an insulating layer 4a in which via conductors (interlayer connection conductors) 8a1, 8a2, 8a3, 8a4 are provided (first layer); a connecting portion 6ac disposed in the first bonding portion 10; a conducting path 6b defining and functioning as a signal conductor connecting between the electrode 10b and the electrode 12b through the via conductors 8a2 and 8a3; an insulating layer 4b in which interlayer connection conductors 8b1, 8b2 are provided (second layer); a conducting path 6c defining and functioning as a ground conductor connecting the electrode 10a and the electrode 12a through the via conductor 8a1, the connecting portion 6ac, and the via conductor 8b1 disposed in the first bonding portion 10 as well as the via conductor 8a4, the connecting portion 6ac, and the via conductor 8b2 disposed in the second bonding portion 12; and an insulating layer 4c (third layer).

The electrode 10a and the connecting portion 6ac are divided and disposed at three positions so as to surround the electrode 10b in planar view. Similarly, the electrode 12a and the connecting portion 6ac are also divided and disposed at three positions so as to surround the electrode 12b in planar view.

These insulating layers 4a, 4b, and 4c are laminated by a pressure press, for example (see FIGS. 3A and 3B). Additionally, on a surface on the insulating layer 4a side of a laminated body, an insulating layer 4d including openings patterned for electrodes and bonding patterns is disposed to define an integrated insulating layer 4 (see FIG. 3C). As a result, the electric element 2 having a flat cross-sectional shape is obtained such that the conducting path 6b defining and functioning as a signal conductor is sandwiched between the conducting paths 6a and 6c defining and functioning as ground conductors in the thickness direction Z.

FIGS. 1A and 1B are plan views of the integrated insulating layer 4 as viewed from the insulating layer 4d side, and this surface is a mounting surface to a substrate. The electric element 2 includes the first bonding portion 10 provided with the electrodes 10a, 10b including metal surfaces exposed from the insulating layer 4d, and the second bonding portion 12 provided with the electrodes 12a, 12b including metal surfaces exposed from the insulating layer 4d, as well as a line portion 14 connecting between the first bonding portion 10 and the second bonding portion 12.

The line portion 14 is includes a linear region 14a connecting to the first bonding portion 10 and having an outer shape linearly extending on both sides, a curved region 14b connecting to the linear region 14a and having an outer shape curved on both sides, and a linear region 14c connecting to the curved region 14b and having an outer shape linearly extending on both sides, and the linear region 14c connects to the second bonding portion 12. More specifically, the curved region 14b having an outer shape curved on both sides may be considered as a region sandwiched by portions having an outer shape curved on both sides of the insulating layer 4b sandwiching the signal conductor (conducting path) 6b. The curved region 14b of the present preferred embodiment has a continuously curved planar shape. The boundaries between the curved region 14b and the linear regions 14a, 14c are indicated by imaginary lines (dashed-dotted lines). Similarly, in the other figures, the boundaries between the curved region and the linear regions are indicated by imaginary lines (dashed-dotted lines).

Furthermore, a plurality of bonding patterns 20 to 26 including metal surfaces exposed from the insulating layer 4 (4d) are provided in the line portion 14.

The electric element 2 having such a flat cross-sectional shape has an elongated shape and may be suitably used for wiring in a terminal housing having a reduced thickness. Furthermore, the width of the line portion 14 is narrower than the widths of the first bonding portion 10 and the second bonding portion 12, which is advantageous for routing in the terminal housing.

In the electric element 2 shown in FIG. 1A, two sides of the contour of the first bonding pattern 20 disposed in the curved region 14b are parallel or substantially parallel to two sides of the contour of the first bonding pattern 22 that is one of the bonding patterns adjacent in the extending direction of the line portion 14 (see symbols indicative of parallelism). In all of the preferred embodiments, the first bonding pattern 20 is disposed in the curved region 14b between the imaginary lines (dashed-dotted lines).

More specifically, the second bonding pattern 22 is disposed in the linear region 14a. Two opposite sides of each of the contours of the first bonding pattern 20 and the second bonding pattern 22 are parallel or substantially parallel.

Furthermore, two sides of the first bonding pattern 20 disposed in the curved region 14b in a direction orthogonal or substantially orthogonal to the extending direction of the line portion 14 are parallel or substantially parallel to two sides of the adjacent bonding pattern disposed in the linear region 14a in a direction along the extending direction of the line portion 14.

On the other hand, in the electric element 2 shown in FIG. 1B, two sides of the contour of the first bonding pattern 20 disposed in the curved region 14b are parallel or substantially parallel to two sides of each of the contours of the second bonding pattern 22 and the third bonding pattern 24 that are bonding patterns adjacent on both sides in the extending direction of the line portion 14 (see symbols indicative of parallelism).

More specifically, the second bonding pattern 22 and the third bonding pattern 24 are disposed in the linear regions 14a, 14c. Two opposite sides of each of the contours of the first bonding pattern 20, the second bonding pattern 22, and the third bonding pattern 24 are parallel or substantially parallel. Furthermore, two sides of the first bonding pattern 20 disposed in the curved region 14b in a direction orthogonal or substantially orthogonal to the extending direction of the line portion 14 are parallel or substantially parallel to sides of second bonding pattern 22, and the third bonding pattern 24 disposed in the linear regions 14a, 14c in a direction along the extending direction of the line portion 14.

Figure 4A:
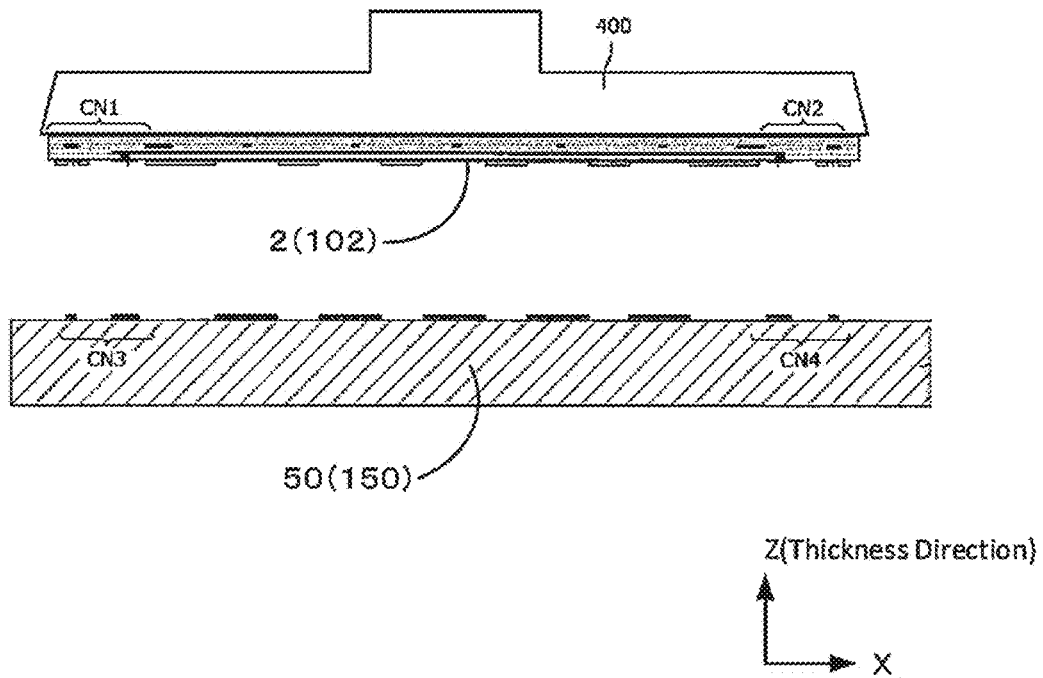
FIGS. 4A and 4B are a side view and a plan view schematically showing a method of placing the electric element on a substrate.
Figure 4B:
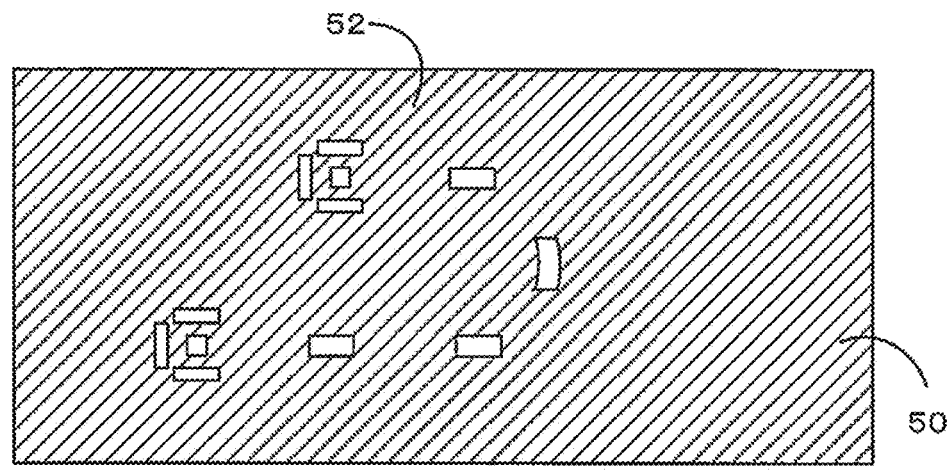
Figure 10:
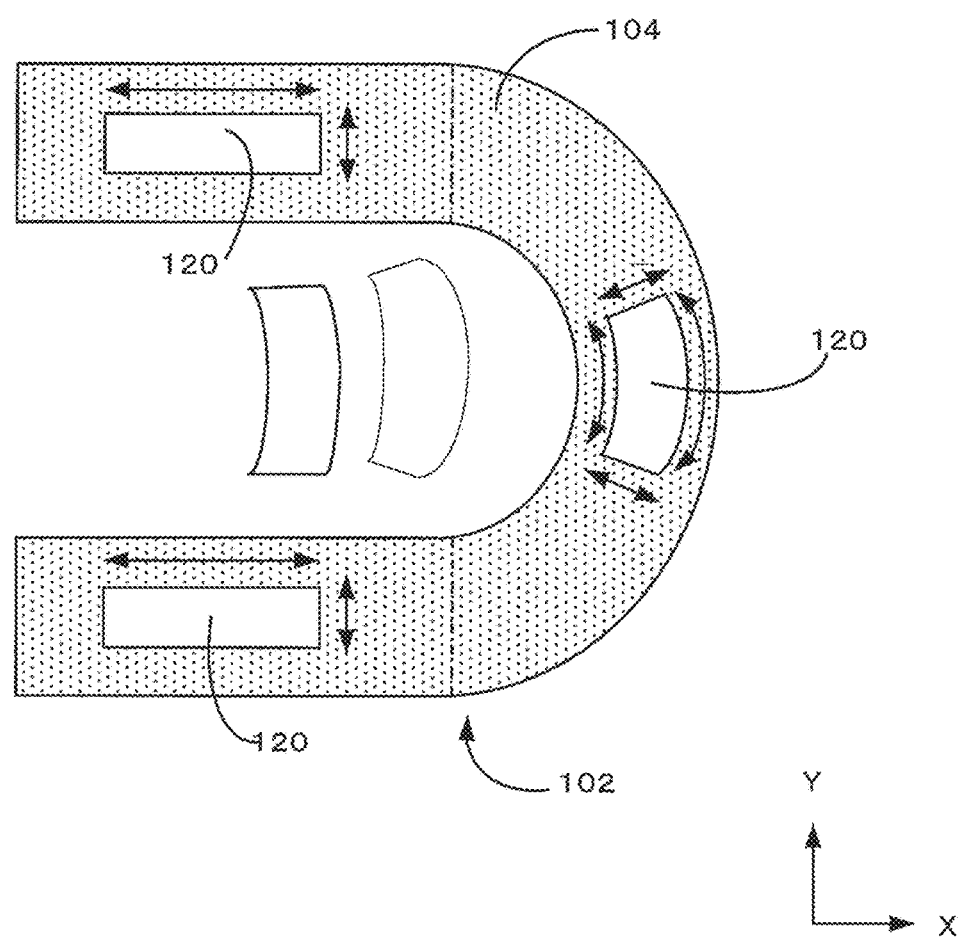
FIG. 10 is a plan view schematically showing a comparative example of an electric element having bonding patterns.

FIGS. 4A and 4B are a side view and a plan view schematically showing a method of placing the electric element on a substrate. FIG. 4A is a side view showing a tip jig 400 sucking the electric element 2 (102), and FIG. 4B is a plan view showing a substrate 50. FIG. 10 is a plan view schematically showing a comparative example of an electric element including bonding patterns.

Description will be provided while comparing the case of mounting on the substrate 50 the electric element 2 including the two sides of each of the contours of the adjacent bonding patterns that are parallel or substantially parallel as shown in FIGS. 1A and 1B with the case of mounting on the substrate 50 the electric element 102 in which sides of the contours of the adjacent bonding patterns are not parallel.

As shown in FIG. 4A, a vacuum suction chuck including the tip jig 400 attached thereto picks up and places the electric element 2 onto a predetermined position of the substrate 50. In this case, as shown in FIG. 4B, the substrate 50 includes a bonding agent (solder) 52 applied in advance to surfaces of patterns (lands) corresponding to the electrodes 10a, 10b, 12a, 12b and the bonding patterns 20 to 26 disposed on the electric element 2. The electric element 2 is placed such that the positions of the electrodes 10a, 10b, 12a, 12b and the bonding patterns 20 to 26 coincide with the positions of the corresponding patterns (lands). Subsequently, the substrate 50 is passed through a reflow furnace so that the electric element 2 is soldered together with other elements by a batch reflow soldering method. Therefore, the electric element 2 is mounted as a surface mounting component with other elements.

The electric element 102 is also mounted in the same procedure.

The solder heated and melted in the reflow furnace flows due to surface tension along the electrode pattern shape. It is considered that a stress occurs in the regions of the line portion in this case along the directions of the sides of the contours of the bonding patterns.

Particularly, in the curved region of the line portion, the electric element 102 (comparative example) as shown in FIG. 10 has the stress generated in different directions in the respective bonding patterns 120 (see arrows), so that the direction of the stress generated in the electric element 102 is not uniform when the solder flows, which is highly likely to cause misalignment relative to a substrate 150.

On the other hand, in the electric element 2 according to the present preferred embodiment as shown in FIG. 1A, two sides of the first bonding pattern 20 disposed in the curved region 14b are parallel or substantially parallel to two sides of the adjacent first bonding pattern 20, so that the stress generation direction is uniform when the solder flows. Therefore, the occurrence of misalignment of the electric element 2 relative to the substrate 50 is reduced or prevented at the time of mounting using reflow.

Particularly, in the case that two opposite sides are parallel or substantially parallel, the stress generation direction is effectively made uniform when the solder flows. Although the two opposite sides are parallel or substantially parallel in the present preferred embodiment, the present invention is not limited thereto, and the two opposite sides may not be parallel.

Furthermore, in the electric element 2 shown in FIG. 1B, two sides are parallel or substantially parallel to two sides not only between the first bonding pattern 20 and the adjacent second bonding pattern 22 but also between the first bonding pattern 20 and the adjacent third bonding pattern 24, so that the stress generation direction is effectively made uniform when the solder flows.

Furthermore, in the electric element 2 shown in FIG. 1B, an interval La of closest sides parallel or substantially parallel to each other between the first bonding pattern 20 and the second bonding pattern 22 is preferably equal or substantially equal to an interval Lb of closest sides parallel or substantially parallel to each other between the first bonding pattern 20 and the third bonding pattern 24.

Such an arrangement improves the symmetry at stress generation positions, and the occurrence of misalignment of the electric element relative to the substrate is more effectively reduced or prevented at the time of mounting using reflow.

In the case that the electric element 2 has an elongated shape, it is not easy to prevent the misalignment of the elongated object when the solder flows. However, the configuration as described above reliably reduces or prevents the occurrence of misalignment of the electric element 2 relative to the substrate 50 at the time of mounting using reflow.

Particularly, in the case that the width of the line portion 14 is narrower than the width of the bonding portions 10, 12, it is not easy to prevent the misalignment of the line portion 14 when the solder flows. However, the configuration as described above reliably reduces or prevents the occurrence of misalignment of the electric element 2 relative to the substrate 50 at the time of mounting using reflow.

As described above, in the case that the electric element 2 is surface-mounted on the substrate 50 by the bonding material (solder), a high-quality electronic device with little misalignment of the electric element 2 relative to the substrate 50 is able to be provided.

A method of manufacturing the electric element 2 shown in FIGS. 1A and 1B will be described in more detail with reference to FIGS. 3A to 3C.

First, three insulating films each including one surface entirely or substantially entirely lined with copper foil are prepared. For the insulating film, a thermoplastic resin such as liquid crystal polymer (LCP), for example, may preferably be used. Subsequently, a patterning process such as photolithography, for example, is performed to form the insulating layer 4a in which the conducting path 6a is formed, the insulating layer 4b in which the conducting path 6b is formed, and the insulating layer 4c in which the conducting path 6c is formed.

Subsequently, via holes penetrating only an insulating base material is formed in the insulating layers 4a and 4b by laser processing, for example, from the side of the surface not lined with the copper foil, and the via holes are filled with conductive paste 8'(8a1' to 8a4', 8b1' and 8b2').

Subsequently, the insulating layers 4a to 4c are bonded by a pressure press, for example, to form a laminated body. By using the thermoplastic resin, the insulating layers 4a to 4c are firmly bonded and integrated, and delamination is more effectively reduced or prevented when a bending force is applied. Particularly, since the plurality of the insulating layers 4a to 4c are directly laminated without intervention of a different type of an insulating layer, such as an adhesive layer, for example, an interface between different insulating layers is not formed, and the delamination is further reduced or prevented. The conductive paste 8' filled in the through-holes at step 1 is heated and cured to form the via conductors 8 (8a1 to 8a4, 8b1 and 8b2).

Subsequently, the patterned insulating layer 4d is laminated on the surface of the laminated body on the insulating layer 4a side to form the integrated insulating layer 4. As a result, the electric element 2 including the electrodes 10a, 10b, 12a, 12b and the bonding patterns 20 to 26 including metal surfaces exposed from the insulating layer 4a as shown in FIGS. 1A and 1B is manufactured.

Second Preferred Embodiment

FIG. 5 is a plan view schematically showing an electric element according to a second preferred embodiment of the present invention.

The electric element 2 according to the present preferred embodiment is different from the first preferred embodiment in that two sides of the contour of the first bonding pattern 20 disposed in the curved region 14b are parallel or substantially parallel to two sides of each of the contours of the second bonding pattern 22, the third bonding pattern 24, and the fourth bonding pattern 28 disposed in the linear regions 14a, 14c. The electric element 2 is also different in that two sides of the first bonding pattern 20 disposed in the curved region 14b in the direction along the extending direction of the line portion 14 are parallel or substantially parallel to sides of the second bonding pattern 22, the third bonding pattern 24, and the fourth bonding pattern 28 disposed in the linear regions 14a, 14c in the direction orthogonal or substantially orthogonal to the extending direction of the line portion 14 (see symbols indicative of parallelism).

Furthermore, in the electric element 2 shown in FIG. 5, intervals L1, L2, and L3 of closest sides parallel or substantially parallel to each other are preferably equal or substantially equal between the adjacent bonding patterns including first bonding pattern 20, the second bonding pattern 22, the third bonding pattern 24, and the fourth bonding pattern 28.

Such an arrangement further improves the symmetry at stress generation positions, and the occurrence of misalignment of the electric element relative to the substrate is further effectively reduced or prevented at the time of mounting using reflow.

Third Preferred Embodiment

Figure 6:
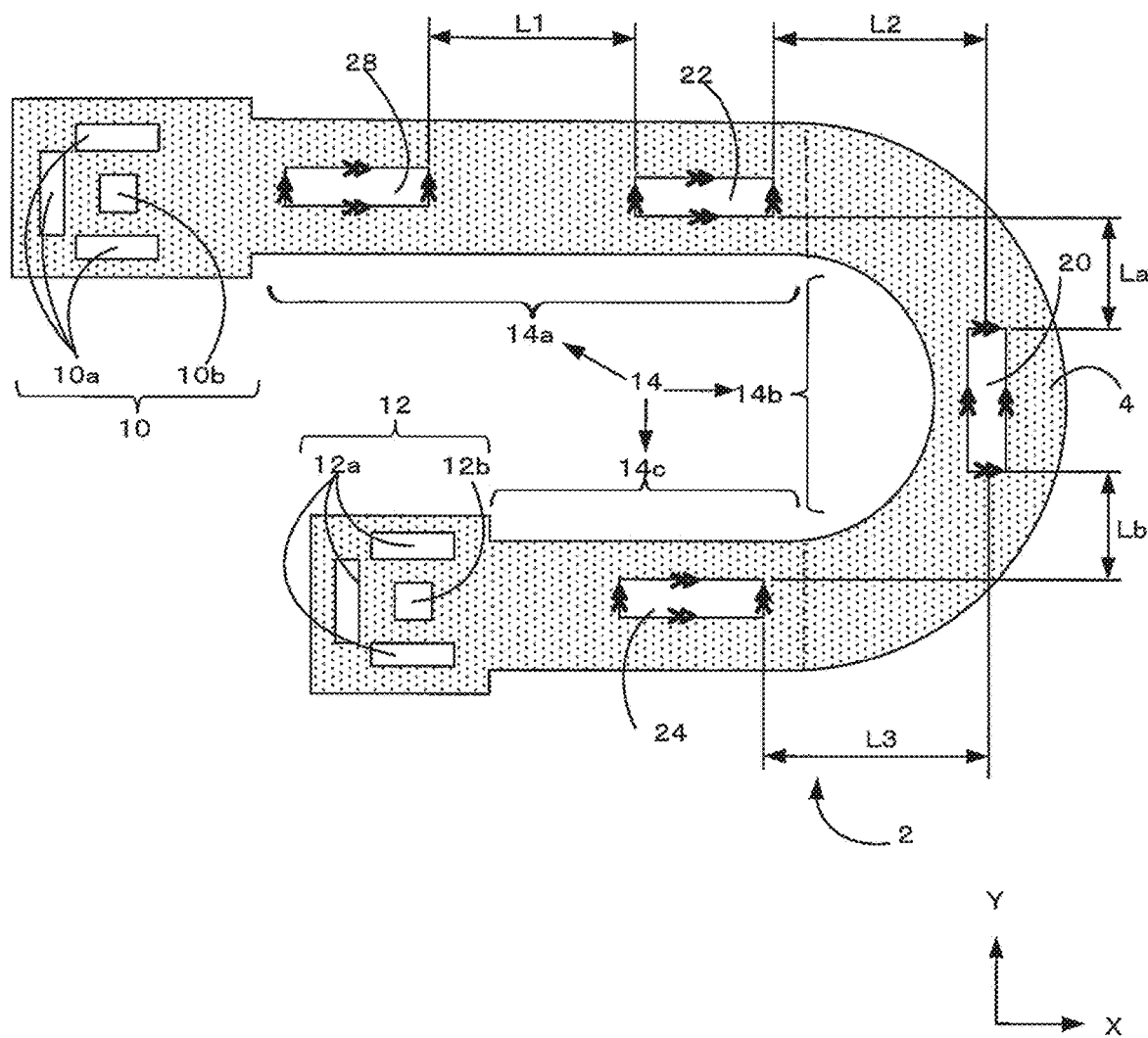
FIG. 6 is a plan view schematically showing an electric element according to a third preferred embodiment of the present invention.

FIG. 6 is a plan view schematically showing an electric element according to a third preferred embodiment of the present invention.

The electric element 2 according to the present preferred embodiment is different from the first preferred embodiment in that four sides of the contour of the first bonding pattern 20 disposed in the curved region 14b are parallel or substantially parallel to four sides of each of the contours of the second bonding pattern 22, the third bonding pattern 24, and the fourth bonding pattern 28 disposed in the linear regions 14a, 14c. The four sides shown in FIG. 6 may also be referred to as two pairs of two opposite sides.

In the case that the four sides are parallel or substantially parallel as described above, the stress generation direction is further effectively made uniform when solder flows. In addition to the case that two pairs of two opposite sides are parallel or substantially parallel, four sides arbitrarily arranged in one bonding pattern may be parallel or substantially parallel. It is noted the stress generation direction is able to made uniform when the solder flows as long as the four sides of the contour are parallel or substantially parallel at least between the first bonding pattern 20 and the second bonding pattern 22.

In the present preferred embodiment, the intervals L1, L2, and L3 of closest sides parallel or substantially parallel to each other are preferably equal or substantially equal between the adjacent bonding patterns in the X-axis direction, and the intervals La and Lb of closest sides parallel or substantially parallel to each other are preferably equal or substantially equal between the adjacent bonding patterns also in the Y-axis direction. Such an arrangement further improves the symmetry at stress generation positions, and the occurrence of misalignment of the electric element relative to the substrate is further effectively reduced or prevented at the time of mounting using reflow.

Fourth Preferred Embodiment

Figure 7:
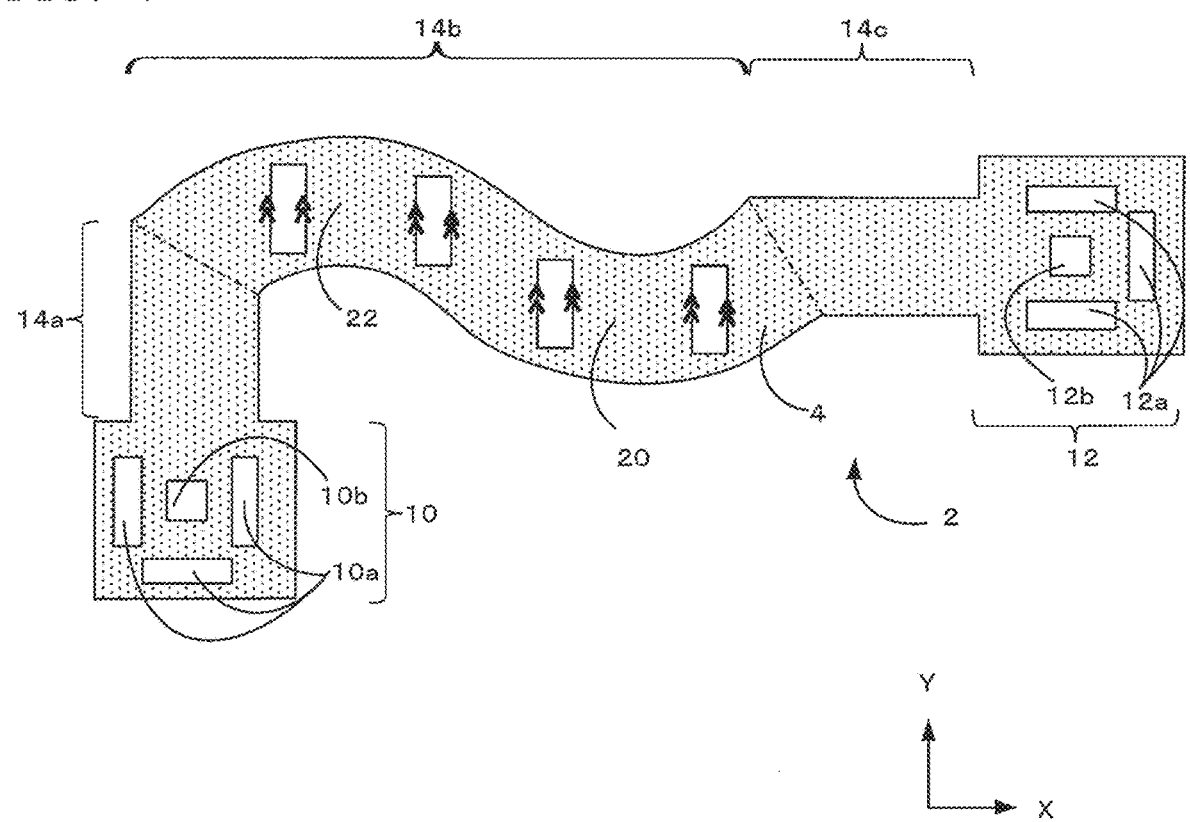
FIG. 7 is a plan view schematically showing an electric element according to a fourth preferred embodiment of the present invention.

FIG. 7 is a plan view schematically showing an electric element according to a fourth preferred embodiment of the present invention.

The electric element 2 according to the present preferred embodiment is different from the first preferred embodiment in that not only the first bonding pattern 20 but also the second bonding pattern 22 is disposed in the curved region 14b. Specifically, in the electric element 2 shown in FIG. 7, two sides of the contour of the first bonding pattern 20 disposed in the curved region 14b are parallel or substantially parallel to two sides of the contour of the adjacent second bonding pattern 22 disposed in the curved region 14b (see symbols indicative of parallelism).

Even in such a case, the stress generation direction is made uniform when solder flows, and the occurrence of misalignment of the electric element 2 relative to the substrate 50 is reduced or prevented at the time of mounting using reflow. Although the curved region 14b shown in FIG. 7 has a substantially S-shaped planar shape defined by connecting regions different in bending direction, the present invention is not limited thereto, and the curved region may be curved in the same direction. Additionally, one curved region may be provided with three or more bonding patterns including two sides that are parallel or substantially parallel.

Fifth Preferred Embodiment

Figure 8A:
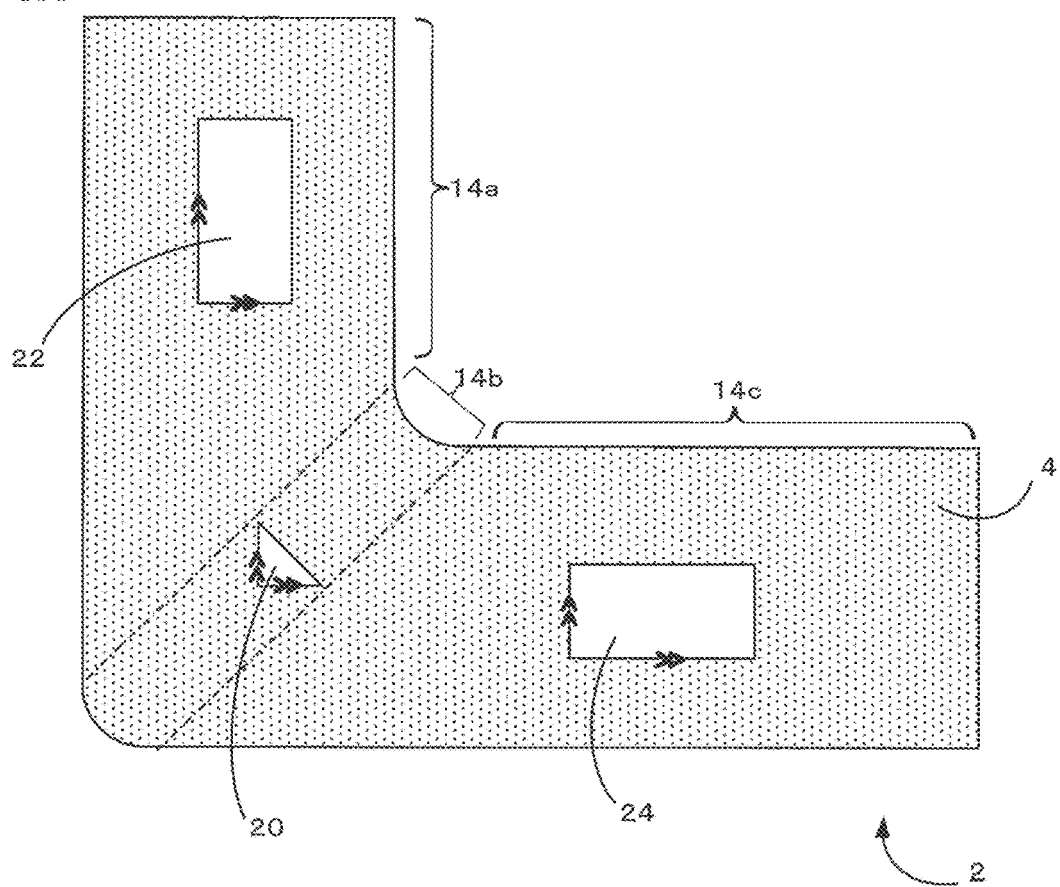
FIG. 8A is a plan view schematically showing an electric element according to a fifth preferred embodiment of the present invention.

FIG. 8A is a plan view schematically showing an electric element according to a fifth preferred embodiment of the present invention.

The electric element 2 according to the present preferred embodiment is different from the first preferred embodiment in that the electric element has a substantially L-shaped planar shape as a whole. Additionally, the curved region 14b with an outer shape curved on both sides has an arc shape with the same or substantially the same radius on the outer and inner sides of a corner portion of the substantially L shape.

Furthermore, the electric element 2 is different in that the two sides parallel or substantially parallel between the first bonding pattern 20 and the second bonding pattern 22 (or the third bonding pattern 24) are two adjacent sides connected via a vertex rather than the two opposite sides. Specifically, in the electric element 2 shown in FIG. 8A, two sides (two adjacent sides connected via a vertex) of the contour of the first bonding pattern 20 disposed in the curved region 14b are parallel or substantially parallel to two sides (two adjacent sides connected via a vertex) of each of the contours of the second bonding pattern 22 and the third bonding pattern 24 disposed in the linear regions 1a, 1c adjacent in the extending direction of the line portion 14 (see symbols indicative of parallelism).

Even in such a case, the stress generation direction is made uniform when solder flows, and therefore, the occurrence of misalignment of the electric element relative to the substrate is accordingly reduced or prevented at the time of mounting using reflow. Even in the case that the first bonding pattern 20 is disposed in the curved region 14b that is continuously curved, if the two adjacent sides connected via a vertex are parallel or substantially parallel, the stress generation direction is able to made uniform in the same or substantially the same way in the directions of respective sides when the solder flows.

In FIGS. 8A to 8D, preferably, the first bonding pattern 20 has a substantially triangular planar shape, and the second bonding pattern 22 and the third bonding pattern 24 have a substantially rectangular planar shape. However, the present invention is not limited thereto, and the bonding patterns may have any other planar shapes as long as the bonding patterns include two adjacent sides connected via a vertex.

Figure 8B:
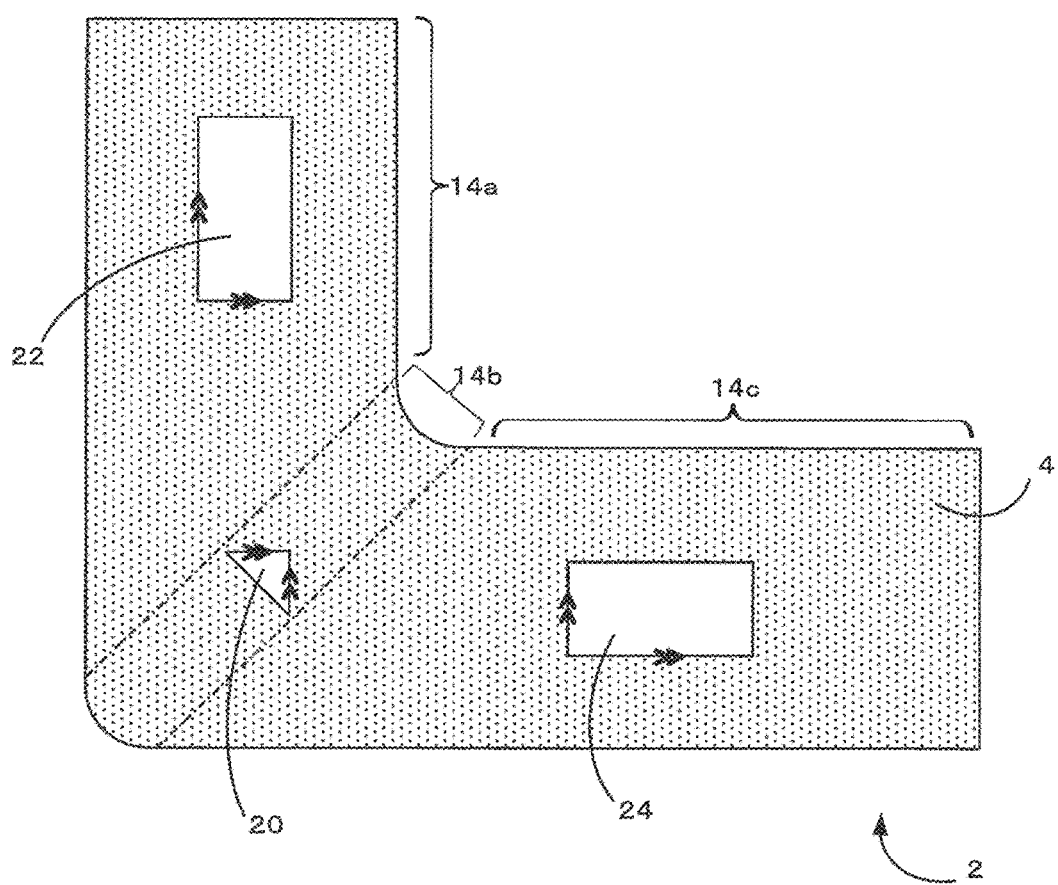
FIG. 8B is a plan view schematically showing a modification of the electric element according to the fifth preferred embodiment of the present invention.
Figure 8C:
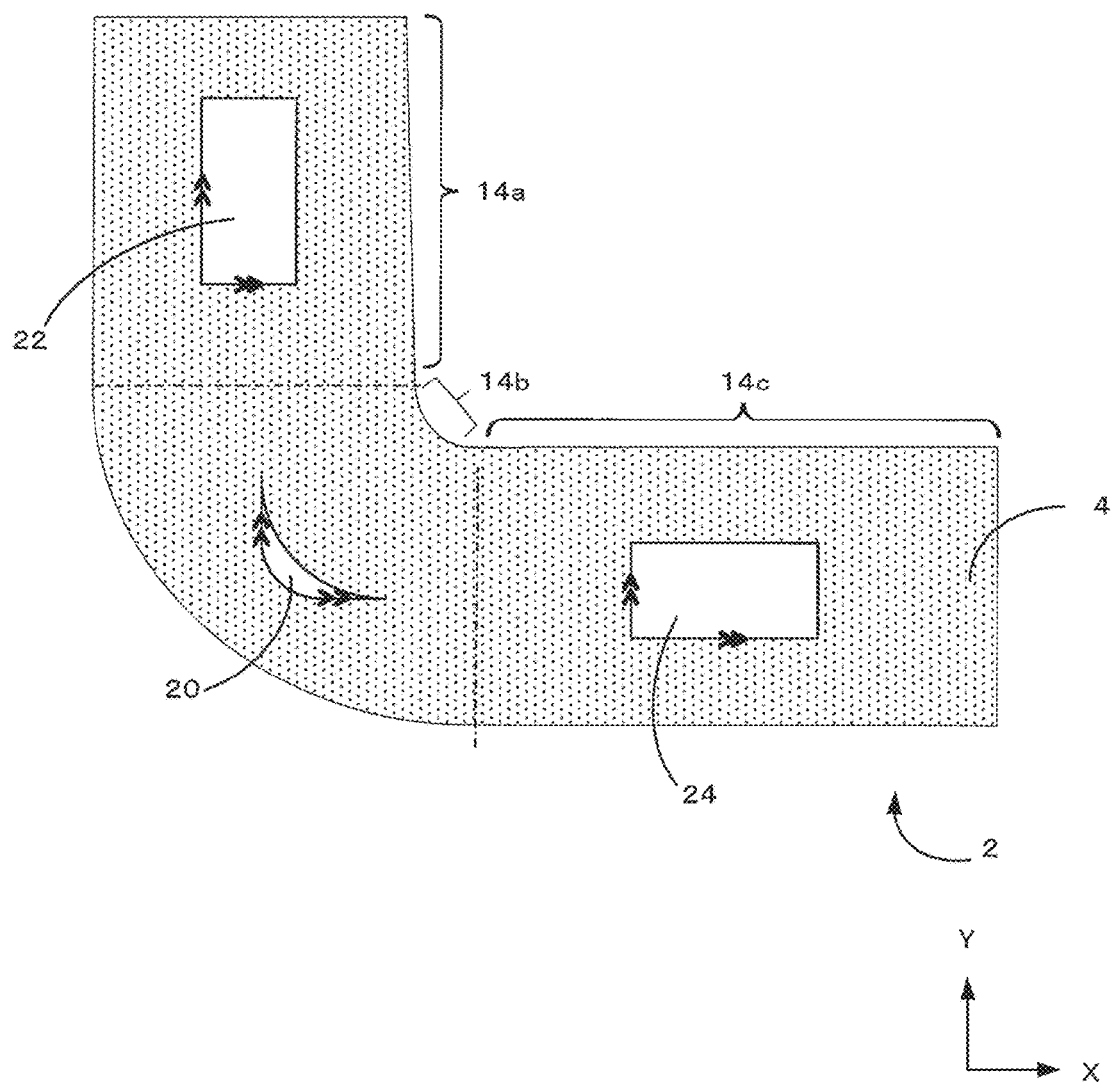
FIG. 8C is a plan view schematically showing a modification of the electric element according to the fifth preferred embodiment of the present invention.
Figure 8D:
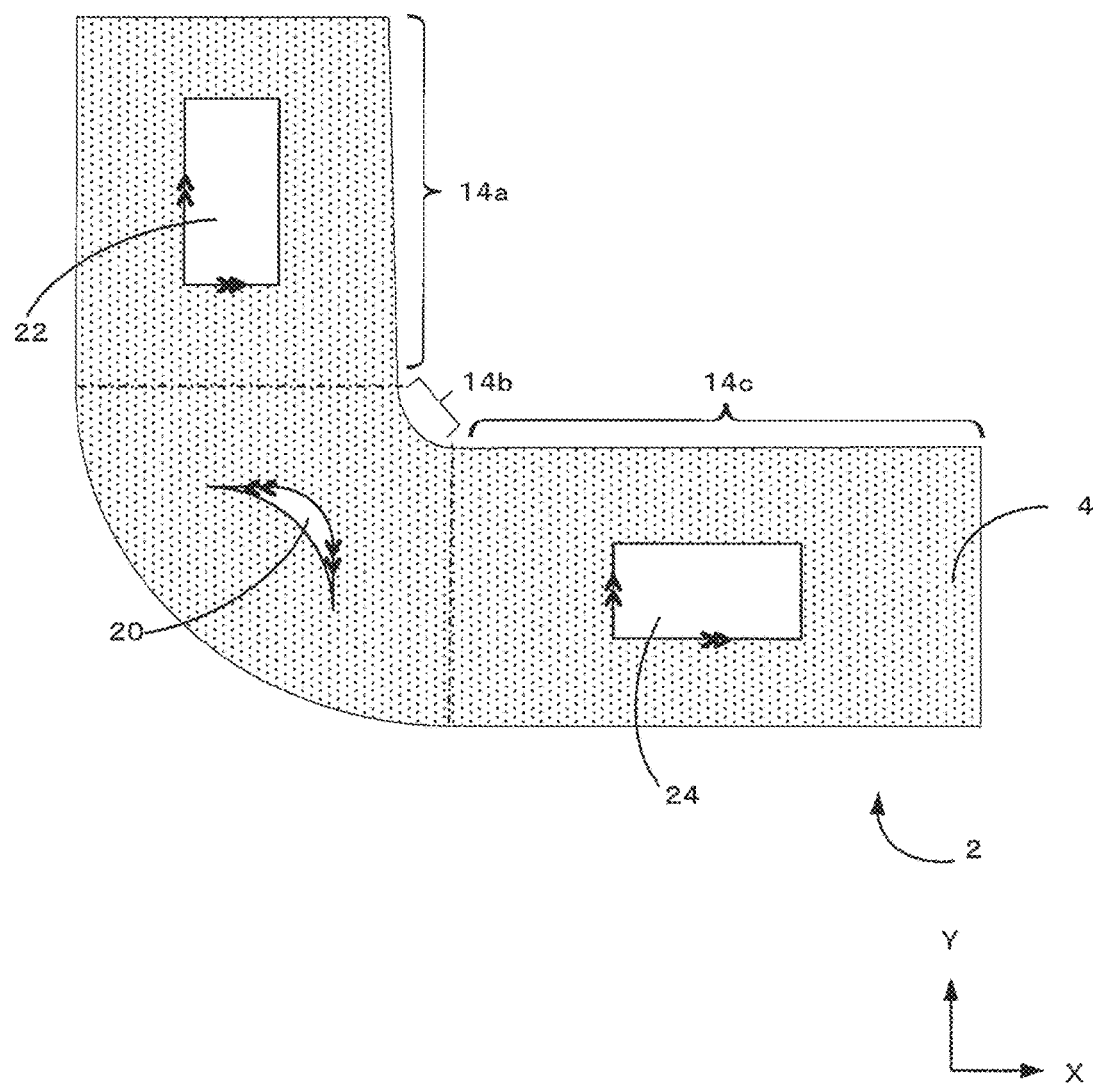
FIG. 8D is a plan view schematically showing a modification of the electric element according to the fifth preferred embodiment of the present invention.

Modifications of the electric element according to the fifth preferred embodiment will be described with reference to FIGS. 8B to 8D. FIGS. 8B to 8D are plan views schematically showing modifications of the electric element according to the fifth preferred embodiment.

In the electric element shown in FIG. 8B, a substantially triangular planar shape defining the first bonding pattern 20 is arranged in the opposite direction as compared to the case shown in FIG. 8A. Specifically, although the electric element shown in FIG. 8A includes the vertex connecting the two sides disposed on the outer corner portion side of the curved region 14b, the electric element shown in FIG. 8B is different in that the vertex connecting the two sides is disposed on the inner corner portion side of the curved region 14b. Even in this case, the same or substantially same advantageous effects are produced as in the case of FIG. 8A.

The electric elements shown in FIGS. 8C and 8D are different from the electric elements shown in FIGS. 8A and 8B in that two sides parallel or substantially parallel to sides of the second bonding pattern 22 (or the third bonding pattern 24) are connected via a curved portion. Additionally, in the region opposite to the vertex side, the two sides are connected via a gently curved portion from the vertex side. In the electric element shown in FIG. 8C, as in the case of FIG. 8A, the curved portion on the vertex side is disposed on the outer corner portion side of the curved region 14b, and in the electric element shown in FIG. 8D, as in the case of FIG. 8B, the curved portion on the vertex side is disposed on the inner corner portion side of the curved region 14b. Even in these cases, the same or substantially the same advantageous effects are obviously produced as in the case of FIG. 8A.

Sixth Preferred Embodiment

FIG. 9 is a plan view schematically showing an electric element according to a sixth preferred embodiment of the present invention.

The electric element 2 according to the present preferred embodiment is different from the first preferred embodiment in that the electric element has a substantially L-shaped planar shape as a whole. Additionally, the curved region 14b with an outer shape curved on both sides has an arc shape including a large outer radius and a small inner radius on the outer and inner sides of a corner portion of the substantially L shape. The outer and inner arcs may be concentrically be provided.

In the electric element 2 according to the present preferred embodiment, the two adjacent sides connected via a vertex and the two opposite sides are both parallel or substantially parallel between the first bonding pattern 20 and the second bonding pattern 22 (or the third bonding pattern 24). Additionally, sides are connected by a curved portion in the inner corner portion opposite to the vertex of the curved region 14b. Even in the present preferred embodiment, the stress generation direction is made uniform when solder flows, and as a result, the occurrence of misalignment of the electric element 2 relative to the substrate 50 is reduced or prevented at the time of mounting using reflow.

In the structures shown in the preferred embodiments described above, the one conducting path 6b defining and functioning as a signal conductor is sandwiched in the thickness direction Z by the conducting paths 6a and 6c defining and functioning as the ground conductors. However, the present invention is not limited thereto. The electric element may include conducting paths defining and functioning as a plurality of signal conductors disposed between conducting paths defining and functioning as the ground conductors. Additionally, in the preferred embodiments described above, the conducting paths defining and functioning as the ground conductors are exposed from the insulating layer to define the bonding patterns. However, the present invention is not limited thereto. For example, a metal dedicated to bonding patterns may be exposed from the insulating layer to define bonding patterns. The contour shapes of the bonding pattern 20 shown in the figures are merely examples, and any other planar shapes including at least two sides may be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electric element comprising:
   electrodes;
   a conducting path connecting the electrodes;
   an insulating layer covering the conducting path;
   bonding portions in which the electrodes are disposed; and
   a line portion connecting between the bonding portions;
   wherein the line portion includes a curved region sandwiched by portions having an outer shape curved on both sides of the insulating layer disposed to sandwich the conducting path;

the line portion includes a plurality of bonding patterns including metal surfaces exposed from the insulating layer;

each of contours of the bonding patterns includes at least two linear sides;

at least two sides of the contour of a first bonding pattern disposed in the curved region are parallel or substantially parallel to at least two sides of the contour of at least one of the bonding patterns adjacent in an extending direction of the line portion;

no side of the contour of the first bonding pattern disposed in the curved region is parallel to a periphery of the curved region;

at least two sides of the contour of the first bonding pattern are parallel or substantially parallel to at least two sides of each of the contours of a second bonding pattern and a third bonding pattern that are bonding patterns on both sides adjacent in the extending direction of the line portion; and an interval of closest sides that are parallel or substantially parallel to each other between the first bonding pattern and the second bonding pattern is equal or substantially equal to an interval of closest sides that are parallel or substantially parallel to each other between the first bonding pattern and the third bonding pattern.

2. The electric element according to claim 1, wherein four or more adjacent bonding patterns including at least the first bonding pattern, the second bonding pattern, and the third bonding pattern are disposed at equal or substantially equal intervals between closest sides that are parallel or substantially parallel to each other.

3. An electric element comprising:
electrodes;
a conducting path connecting the electrodes;
an insulating layer covering the conducting path;
bonding portions in which the electrodes are disposed; and
a line portion connecting between the bonding portions; wherein
the line portion includes a curved region sandwiched by portions having an outer shape curved on both sides of the insulating layer disposed to sandwich the conducting path;
the line portion includes a plurality of bonding patterns including metal surfaces exposed from the insulating layer;
each of contours of the bonding patterns includes at least two linear sides;
at least two sides of the contour of a first bonding pattern disposed in the curved region are parallel or substantially parallel to at least two sides of the contour of at least one of the bonding patterns adjacent in an extending direction of the line portion;
no side of the contour of the first bonding pattern disposed in the curved region is parallel to a periphery of the curved region; and
the at least two sides are two adjacent sides connected via a vertex.

4. An electronic device comprising:
an electric element; and
a substrate; wherein
the electric element is surface-mounted on the substrate by a bonding material;
the electric element includes:
electrodes;
a conducting path connecting the electrodes;
an insulating layer covering the conducting path;
bonding portions in which the electrodes are disposed; and
a line portion connecting between the bonding portions;
the line portion includes a curved region sandwiched by portions having an outer shape curved on both sides of the insulating layer disposed to sandwich the conducting path;
the line portion includes a plurality of bonding patterns including metal surfaces exposed from the insulating layer;
each of contours of the bonding patterns includes at least two linear sides;
at least two sides of the contour of a first bonding pattern disposed in the curved region are parallel or substantially parallel to at least two sides of the contour of at least one of the bonding patterns adjacent in an extending direction of the line portion;
no side of the contour of the first bonding pattern disposed in the curved region is parallel to a periphery of the curved region;
at least two sides of the contour of the first bonding pattern are parallel or substantially parallel to at least two sides of each of the contours of a second bonding pattern and a third bonding pattern that are bonding patterns on both sides adjacent in the extending direction of the line portion; and
an interval of closest sides that are parallel or substantially parallel to each other between the first bonding pattern and the second bonding pattern is equal or substantially equal to an interval of closest sides that are parallel or substantially parallel to each other between the first bonding pattern and the third bonding pattern.

5. The electronic device according to claim 4, wherein four or more adjacent bonding patterns including at least the first bonding pattern, the second bonding pattern, and the third bonding pattern are disposed at equal or substantially equal intervals between closest sides that are parallel or substantially parallel to each other.

6. An electronic device comprising:
an electric element; and
a substrate; wherein
the electric element is surface-mounted on the substrate by a bonding material;
the electric element includes:
electrodes;
a conducting path connecting the electrodes;
an insulating layer covering the conducting path;
bonding portions in which the electrodes are disposed; and
a line portion connecting between the bonding portions;
the line portion includes a curved region sandwiched by portions having an outer shape curved on both sides of the insulating layer disposed to sandwich the conducting path;
the line portion includes a plurality of bonding patterns including metal surfaces exposed from the insulating layer;
each of contours of the bonding patterns includes at least two linear sides;
at least two sides of the contour of a first bonding pattern disposed in the curved region are parallel or substantially parallel to at least two sides of the contour of at least one of the bonding patterns adjacent in an extending direction of the line portion;

no side of the contour of the first bonding pattern disposed in the curved region is parallel to a periphery of the curved region; and the at least two sides are two adjacent sides connected via a vertex.

7. An electric element comprising:
electrodes;
a conducting path connecting the electrodes;
an insulating layer covering the conducting path;
bonding portions in which the electrodes are disposed; and
a line portion connecting between the bonding portions; wherein
the line portion includes a curved region sandwiched by portions having an outer shape curved on both sides of the insulating layer disposed to sandwich the conducting path;
the line portion includes a plurality of bonding patterns including metal surfaces exposed from the insulating layer;
each of contours of the bonding patterns includes at least two linear sides;
at least two sides of the contour of a first bonding pattern disposed in the curved region are parallel or substantially parallel to at least two sides of the contour of at least one of the bonding patterns adjacent in an extending direction of the line portion; and
the first bonding pattern is bonded to an element that is external to the electric element.

8. An electric element comprising:
electrodes;
a conducting path connecting the electrodes;
an insulating layer covering the conducting path;
bonding portions in which the electrodes are disposed; and
a line portion connecting between the bonding portions; wherein
the line portion includes a curved region sandwiched by portions having an outer shape curved on both sides of the insulating layer disposed to sandwich the conducting path;
the line portion includes a plurality of bonding patterns including metal surfaces exposed from the insulating layer;
each of contours of the bonding patterns includes at least two linear sides;
at least two sides of the contour of a first bonding pattern disposed in the curved region are parallel or substantially parallel to at least two sides of the contour of at least one of the bonding patterns adjacent in an extending direction of the line portion;
at least two sides of the contour of the first bonding pattern are parallel or substantially parallel to at least two sides of each of the contours of a second bonding pattern and a third bonding pattern that are bonding patterns on both sides adjacent in the extending direction of the line portion; and
an interval of closest sides that are parallel or substantially parallel to each other between the first bonding pattern and the second bonding pattern is equal or substantially equal to an interval of closest sides that are parallel or substantially parallel to each other between the first bonding pattern and the third bonding pattern.

9. The electric element according to claim 8, wherein four or more adjacent bonding patterns including at least the first bonding pattern, the second bonding pattern, and the third bonding pattern are disposed at equal or substantially equal intervals between closest sides that are parallel or substantially parallel to each other.

10. An electric element comprising:
electrodes;
a conducting path connecting the electrodes;
an insulating layer covering the conducting path;
bonding portions in which the electrodes are disposed; and
a line portion connecting between the bonding portions; wherein
the line portion includes a curved region sandwiched by portions having an outer shape curved on both sides of the insulating layer disposed to sandwich the conducting path;
the line portion includes a plurality of bonding patterns including metal surfaces exposed from the insulating layer;
each of contours of the bonding patterns includes at least two linear sides;
at least two sides of the contour of a first bonding pattern disposed in the curved region are parallel or substantially parallel to at least two sides of the contour of at least one of the bonding patterns adjacent in an extending direction of the line portion; and
the at least two sides of the contours of each of the bonding patterns are two adjacent sides connected via a vertex.

* * * * *